United States Patent
Park et al.

(10) Patent No.: US 9,087,668 B2
(45) Date of Patent: Jul. 21, 2015

(54) THERMAL TRANSFER FILM AND ORGANIC ELECTROLUMINESCENT DEVICE PREPARED USING THE SAME

(71) Applicants: Si Kyun Park, Uiwang-si (KR); Kyoung Ku Kang, Uiwang-si (KR); Se Hyun Park, Uiwang-si (KR); Jung Hyo Lee, Uiwang-si (KR); Seong Heun Cho, Uiwang-si (KR)

(72) Inventors: Si Kyun Park, Uiwang-si (KR); Kyoung Ku Kang, Uiwang-si (KR); Se Hyun Park, Uiwang-si (KR); Jung Hyo Lee, Uiwang-si (KR); Seong Heun Cho, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/945,949

(22) Filed: Jul. 19, 2013

(65) Prior Publication Data
US 2014/0023801 A1    Jan. 23, 2014

(30) Foreign Application Priority Data

Jul. 20, 2012  (KR) .................. 10-2012-0079549
Feb. 13, 2013  (KR) .................. 10-2013-0015480

(51) Int. Cl.
*B41M 5/46* (2006.01)
*B41M 5/382* (2006.01)
*H01L 51/00* (2006.01)
*H01J 9/20* (2006.01)
*B41M 5/44* (2006.01)

(52) U.S. Cl.
CPC ............. *H01J 9/20* (2013.01); *B41M 5/38242* (2013.01); *B41M 5/465* (2013.01); *B41M 5/44* (2013.01); *B41M 2205/38* (2013.01); *H01L 51/0013* (2013.01)

(58) Field of Classification Search
CPC ............ B41M 5/465; B41M 5/38242; B41M 2205/30; B41M 2205/38; B41M 5/46; H01L 51/00; H01L 51/0013
USPC ................................. 428/32.81; 156/234, 23
See application file for complete search history.

(56) References Cited

U.S. PATENT DOCUMENTS 8,203,125 B2    6/2012  Shim et al.
8,598,074 B2 *  12/2013 Kawahara et al. ............ 503/201

FOREIGN PATENT DOCUMENTS

KR    10-2010-0028652 A    3/2010

* cited by examiner

*Primary Examiner* — Bruce H Hess
(74) *Attorney, Agent, or Firm* — Lee & Morse, P.C.

(57) ABSTRACT

A thermal transfer film includes a base layer, and a light-to-heat conversion layer on the base layer, the light-to-heat conversion layer including at least one of particles selected from tungsten oxide particles and composite tungsten oxide particles, the particles being present in an amount of about 20 wt % to about 65 wt % in the light-to-heat conversion layer.

17 Claims, 1 Drawing Sheet

THERMAL TRANSFER FILM AND ORGANIC ELECTROLUMINESCENT DEVICE PREPARED USING THE SAME

CROSS-REFERENCE TO RELATED APPLICATIONS

The present application claims priority under 35 U.S.C. §119 to Korean Patent Application No. 10-2012-0079549, filed on Jul. 20, 2012, in the Korean Intellectual Property Office and Korean Patent Application No. 10-2013-0015480, filed on Feb. 13, 2013, in the Korean Intellectual Property Office, and entitled: "Thermal Transfer Film and Organic Electroluminescent Device Prepared Using the Same," which are incorporated by reference herein in their entirety.

BACKGROUND

1. Field

Embodiments relate to a thermal transfer film and an organic electroluminescent device prepared using the same.

2. Description of the Related Art

A light-to-heat conversion (LTHC) layer absorbs light in a certain wavelength range and converts at least some of the absorbed light into heat. When the light-to-heat conversion layer is illuminated with light in an absorption wavelength range, a transfer layer may be transferred by swelling of the light-to-heat conversion layer.

SUMMARY

Embodiments are directed to a thermal transfer film, including a base layer, and a light-to-heat conversion layer on the base layer, the light-to-heat conversion layer including at least one of particles selected from tungsten oxide particles and composite tungsten oxide particles, the particles being present in an amount of about 20 wt % to about 65 wt % in the light-to-heat conversion layer.

The particles may have an average particle diameter of greater than 0 to about 500 nm or less.

The light-to-heat conversion layer may include the tungsten oxide particles, and the tungsten oxide particles may be represented by Formula $W_yO_z$, where W is tungsten, O is oxygen, and $2.2 \leq z/y \leq 3.0$.

The light-to-heat conversion layer may include the composite tungsten oxide particles, and the composite tungsten oxide particles may be represented by Formula $M_xW_yO_z$, where M is at least one element selected from H, He, an alkali metal, an alkali earth metal, a rare earth element, a halogen, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, P, S, Se, Te, Ti, Nb, V, Mo, Ta, Re, Hf, Os, and Bi, W is tungsten, O is oxygen, $0.001 \leq x/y \leq 1.1$, and $2.2 \leq z/y \leq 3.0$.

The light-to-heat conversion layer may include a cured product of a composition that includes at least one of particles selected from the tungsten oxide particles and the composite tungsten oxide particles, and a binder.

The composition may further include an initiator.

The composition may include about 20 wt % to about 65 wt % of the particles, about 10 wt % to about 75 wt % of the binder, and about 0.1 wt % to about 25 wt % of the initiator in tell is of solid content.

The binder may include a UV curable (meth)acrylate resin.

The composition may further include an acrylic polymer dispersant.

The composition may include about 20 wt % to about 65 wt % of the particles, about 10 wt % to about 75 wt % of the binder, about 0.1 wt % to about 25 wt % of the initiator, and about 0.1 wt % to about 30 wt % of the acrylic polymer dispersant in terms of solid content.

The particles may be included in the composition in the form of a dispersed solution that includes the particles, the acrylic polymer dispersant, and a solvent.

The dispersed solution may include about 20 wt % to about 65 wt % of the particles, about 0.1 wt % to about 30 wt % of the acrylic polymer dispersant, and the balance of the solvent.

The light-to-heat conversion layer may have a coating thickness of greater than 0 to about 6 µm or less.

The light-to-heat conversion layer may further include carbon black.

The light-to-heat conversion layer may include about 1 wt % to about 70 wt % of the particles and about 30 wt % to about 99 wt % of carbon black in a mixture of the particles and carbon black.

The thermal transfer film may further include a target layer on the light-to-heat conversion layer, the light-to-heat conversion layer being between the target layer and the base layer.

The thermal transfer film may further include an intermediate layer on the light-to-heat conversion layer, the light-to-heat conversion layer being between the intermediate layer and the base layer, the intermediate layer being between the transfer layer and the light-to-heat conversion layer.

Embodiments are also directed to an organic electroluminescent device prepared using the thermal transfer film according to an embodiment as a donor film.

Embodiments are also directed to a method of preparing an organic electroluminescent device, the method including placing the thermal transfer film according to an embodiment on a substrate, and illuminating the thermal transfer film with light from the base layer side to activate the light-to-heat conversion layer such that a transfer material is transferred from the transfer layer to a pixel region of the substrate.

BRIEF DESCRIPTION OF THE DRAWINGS

Features will become apparent to those of skill in the art by describing in detail example embodiments with reference to the attached drawings in which.

DETAILED DESCRIPTION

Figure 1:
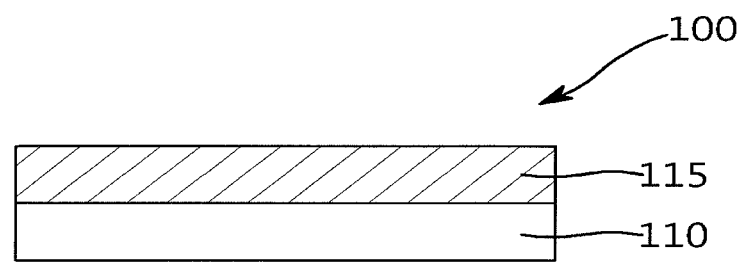
FIG. 1 illustrates sectional view of a thermal transfer film in accordance with one embodiment of the present invention.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

According to an example embodiment, a thermal transfer film may include a light-to-heat conversion layer that includes a light-to-heat conversion material having an excellent near-infrared-light absorbance and a high heat transfer efficiency, exhibits excellent transparency to visible light, uniform coating, good durability against heat and light, high scratch resistance, and high hardness, and may be uniformly coated.

In an example embodiment, the light-to-heat conversion material may include at least one of particles selected from tungsten oxide particles and composite tungsten oxide particles. The tungsten oxide particles and the composite tungsten oxide particles may exhibit high absorption in near-infrared wavelengths (for example: about 800 nm to about 1100 nm), and thus may increase heat transfer efficiency, while providing uniform coating of the light-to-heat conversion layer. The tungsten oxide particles and the composite tungsten oxide particles are metal oxides. Thus, it may be possible to improve scratch resistance and hardness of the light-to-heat conversion layer.

In the light-to-heat conversion layer according to an example embodiment, at least one of particles selected from the tungsten oxide particles and composite tungsten oxide particles as the light-to-heat conversion material may be present in an amount of about 5% by weight (wt %) to about 65 wt %, for example about 20 wt % to about 65 wt % or about 20 wt % to about 59 wt %. Within this range, the light-to-heat conversion layer may have high optical density to provide a high heat transfer efficiency by enhancing the light-to-heat conversion function, a binder may be present in a suitable amount as compared to the amount of the light-to-heat conversion material in a solution for forming the light-to-heat conversion layer, thus to facilitate the preparation of the solution and increase a photocuring rate of the solution, and the light-to-heat conversion layer formed thereby may have high photocuring rate and low or no stickiness.

The tungsten oxide particles and the composite tungsten oxide particles may be fine particles, respectively. In some embodiments, these particles may have an average particle diameter of greater than 0 to about 500 nm or less, for example greater than 0 to about 400 nm or less or about 10 nm to about 200 nm. Within this range, particles may be more easily prepared, and may provide effective thermal characteristics in heat transfer.

The tungsten oxide particles may be represented by Formula $W_yO_z$ (where W is tungsten, O is oxygen, and $2.2 \leq z/y \leq 3.0$). In an example embodiment, $2.45 \leq z/y \leq 3.0$.

Examples of the tungsten oxide particles represented by Formula $W_yO_z$ may include $WO_3$, $W_{18}O_{49}$, $W_{20}O_{58}$, $W_4O_{11}$, and the like.

When z/y is greater than or equal to 2.2, it may be possible to completely avoid formation of a crystalline phase of $WO_2$ that is undesirable for near-infrared absorption materials and to secure chemical stability of the light-to-heat conversion materials. When z/y is less than or equal to 3.0, sufficient amounts of free electrons may be generated to provide efficient near-infrared absorption materials. In addition, when z/y is in the range of $2.45 \leq z/y \leq 3.0$, a compound called Magneli phase is formed, thereby providing excellent durability.

The composite tungsten oxide may be represented by Formula $M_xW_yO_z$ (where M is at least one element selected from H, He, an alkali metal, an alkali earth metal, a rare earth element, a halogen, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, P, S, Se, Te, Ti, Nb, V, Mo, Ta, Re, Hf, Os, and Bi; W is tungsten; O is oxygen; $0.001 \leq x/y \leq 1.1$; and $2.2 \leq z/y \leq 3.0$).

The alkali metal element may include Li, Na, K, Rb, Cs, or Fr.

The alkali earth metal element may include Be, Mg, Ca, Sr, Ba, or Ra.

The rare earth element may include Sc, Y, La, Ce, Pr, Nd, Pm, Sm, Eu, Gd, Tb, Dy, Ho, Er, Tm, Yb, or Lu.

The halogen may include F, Cl, Br, or I.

When the composite tungsten oxide particles represented by Formula $M_xW_yO_z$ have a hexagonal, tetragonal, or cubic crystalline structure, the particles may provide excellent durability. Thus, the composite tungsten oxide particles may have at least one structure selected from the hexagonal, tetragonal, or cubic crystalline structures. For example, when the composite tungsten oxide particles have the hexagonal crystalline structure, M may be at least one of element selected from among Cs, Rb, K, Ti, In, Ba, Li, Ca, Sr, Fe, and Sn.

In an example embodiment, as the amount of the M element(s), x may be determined such that x/y is about 0.001 or more to about 1.1 or less. In an implementation, as the amount of the M element(s), x may be about 0.33±0.3, corresponding to a theoretical x/y of 0.33 for the hexagonal crystalline structure. Desirable optical characteristics may be provided with this added amount of the M element.

In an example embodiment, as the amount of oxygen, z may be determined such that z/y is about 2.2 or more to about 3.0 or less. For example, the composite tungsten oxide may be $Cs_{0.33}WO_3$, $Rb_{0.33}WO_3$, $K_{0.33}WO_3$, $Ba_{0.33}WO_3$, etc. It may be possible to provide useful near-infrared absorption characteristics when x, y and z fall within this range.

The tungsten oxide particles and the composite tungsten oxide particles may be used alone or as mixtures thereof.

The light-to-heat conversion layer may include a cured product of a composition for the light-to-heat conversion layer where the composition further includes a binder, in addition to the tungsten oxide particles and/or the composite tungsten oxide particles as the light-to-heat conversion material described above. The composition may further include an initiator.

The binder may be present in an amount of about 10 wt % to about 75 wt % in the light-to-heat conversion layer in terms of solid content. Within this range, the composition may form a stable matrix for the light-to-heat conversion layer. For example, the binder may be present in an amount of about 15 wt % to about 70 wt % or about 16 wt % to about 70 wt %.

The initiator may include a general photopolymerization initiator.

The initiator may be present in an amount of about 0.1 wt % to about 25 wt % in the light-to-heat conversion layer in terms of solid content. Within this range, the light-to-heat conversion layer having sufficient hardness may be provided, and the initiator may not remain as impurities thereby preventing deterioration in hardness of the light-to-heat conversion layer. For example, the initiator may be present in an amount of about 0.1 wt % to about 10 wt % or about 0.5 wt % to about 7 wt %.

The light-to-heat conversion material may be present in an amount of about 20 wt % to about 65 wt %, for example about 20 wt % to about 59 wt %, in the composition in terms of solid content. Within this range, the light-to-heat conversion layer may have high optical density to provide high thermal transfer efficiency, the composition may be easily prepared, and the matrix of the light-to-heat conversion layer may be easily formed.

The binder may be provided to the composition to allow a dispersion of the light-to-heat conversion material described below to be dispersed in the binder. The binder may include a UV curable resin, a polyfunctional monomer, or mixtures thereof.

The UV curable resin may include at least one selected from (meth)acrylate resins, phenolic resins, polyvinyl butyral resins, polyvinyl acetates, polyvinyl acetal resins, polyvinylidene chlorides, cellulose ethers, cellulose esters, nitrocellulose, polycarbonate, polyalkyl (meth)acrylates, epoxy (meth)acrylates, epoxy resins, urethane resins, ester resins, ether resins, alkyd resins, spiroacetal resins, polybutadienes, polyene-polythiols, and (meth)acrylate resins of polyfunctional compounds such as polyhydric alcohols, etc.

The polyfunctional monomer may include a bi- or higher-functional monomer, a tri- or higher-functional monomer, for example a hexa- or higher-functional monomer. For example, the polyfunctional monomer may be at least one selected from polyfunctional (meth)acrylate monomer and fluorine-modified polyfunctional (meth)acrylate monomer.

The polyfunctional monomer may include at least one selected from the group of polyfunctional (meth)acrylate monomers, such as ethyleneglycol di(meth)acrylate, diethyleneglycol di(meth)acrylate, triethyleneglycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, trimethylolpropane tri(meth)acrylate, ditrimethylolpropane tri(meth)acrylate, ditrimethylolpropane tetra(meth)acrylate, novolac epoxy(meth)acrylate, propyleneglycol di(meth)acrylate, tri(propyleneglycol) di(meth)acrylate, poly(propyleneglycol) di(meth)acrylate, and fluorine-modified polyfunctional (meth)acrylate monomers prepared by fluorine-modification of the polyfunctional (meth)acrylate monomers, etc. For example, the binder may be a UV curable (meth)acrylate resin.

The binder may be present in an amount of about 10 wt % to about 75 wt % in the composition in terms of solid content. Within this range, the composition may form a stable matrix for the light-to-heat conversion layer. For example, the binder may be present in an amount of about 15 wt % to about 70 wt % or about 16 wt % to about 70 wt %.

In the light-to-heat conversion layer, the initiator may increase hardness of the thermal transfer film by curing the binder upon UV irradiation.

As the initiator, any suitable photo-polymerizable initiator may be used. For example, a benzophenone compound such as 1-hydroxycyclohexyl phenyl ketone, etc., may be used.

The initiator may be present in an amount of about 0.1 wt % to about 25 wt % in the composition in terms of solid content. Within this range, the light-to-heat conversion layer having sufficient hardness may be provided, and the initiator may not remain as impurities thereby preventing deterioration in hardness of the light-to-heat conversion layer. For example, the initiator may be present in an amount of about 0.1 wt % to about 10 wt % or about 0.5 wt % to about 7 wt %.

The light-to-heat conversion layer may further include a dispersant.

As the dispersant, a surfactant capable of dispersing and stabilizing the light-to-heat conversion material, or a polymer dispersant capable of dispersing the light-to-heat conversion material, e.g., through steric hindrance of the dispersant adsorbed to the surface of the light-to-heat conversion material, may be used. For example, a polymer dispersant capable of maintaining dispersibility with a solvent removed after curing may be used.

The polymer dispersant may be, e.g., an acrylic polymer dispersant or an acrylate-based polymer dispersant. Acrylic polymer dispersants may include an acrylic ester such as ethyl acrylate and butyl acrylate, or a copolymer thereof as a main chain, and may further include a functional group for adsorbing the dispersant to the tungsten oxide particles or the composite tungsten oxide particles. When the polymer dispersants contain the functional group, the acrylic or acrylate-based polymer dispersant may have an acid value of about 0 to about 23 mgKOH/g, and an amine value of about 30 to about 50 mgKOH/g.

As the dispersant, any suitable dispersant may be used. Examples of the dispersant may include conductive polymers selected from polyaniline, polythiophene, polypyrrole and derivatives thereof; semi-conductive polymers selected from polyphenylene, poly(phenylenevinylene), polyfluorene, poly(3,4-di-substituted thiophene), polybenzothiophene, polyisothianaphthene, polypyrrole, polyfuran, polypyridine, poly-1,3,4-oxadiazole, polyazulene, polyselenophene, polybenzofuran, polyindole, polypyridazine, polypyrene, polyarylamine, and derivatives thereof; and polyvinyl acetate and copolymers thereof, etc.

In the light-to-heat conversion layer, the dispersant may be present in an amount of about 0.1 wt % to about 30 wt %, for example about 5 wt % to about 25 wt %, about 6 wt % to about 24 wt %, or about 8 wt % to about 24 wt %, in terms of solid content. Within this range, it may be possible to improve dispersibility and heat transfer efficiency of the light-to-heat conversion material.

Although the dispersant may be added separately from the light-to-heat conversion material in preparation of the composition for the light-to-heat conversion layer, the dispersant may be generally added to the composition in the form of a dispersed solution which contains the dispersant and the light-to-heat conversion material. The dispersed solution may include the light-to-heat conversion material, the dispersant, and a solvent.

It is desirable that the solvent not obstruct pulverization of the tungsten oxide particles or the composite tungsten oxide particles. To this end, the solvent may include at least one selected from ketone, ester, hydrocarbon compound, and ether solvents. For example, the solvent may include ketones such as methylethylketone, methylisobutylketone, and the like; esters such as ethyl acetate, propyl acetate, isopropyl acetate, butyl acetate, isobutyl acetate, propylene glycol monomethyl ether acetate, propylene glycol monoethyl ether acetate, and the like; hydrocarbon compounds such as toluene, xylene, and the like; and ethers such as ethyl ether, propyl ether, and the like.

The dispersed solution may contain about 20 wt % to about 65 wt % of the light-to-heat conversion material, about 0.1 wt % to about 30 wt % of the dispersant, and the balance of the solvent.

The light-to-heat conversion layer may further include dyes, pigments, carbon black, or mixtures thereof, which may be typically used for the light-to-heat conversion layer, within a range that does not deteriorate dispersibility and thermal transfer efficiency of the light-to-heat conversion material.

Here, any suitable dye or pigment may be used that absorbs light in the visible light or infrared light wavelength range. For example, the dye may include at least one selected from diimmonium dyes, metal-complex dyes, naphthalocyanine dyes, phthalocyanine dyes, polymethine dyes, anthraquinone dyes, porphyrin dyes, and cyanine dyes in metal-complex form, etc.

The pigment may include at least one selected from metal oxide pigments, metal sulfide pigments, and graphite pigments, etc.

The dye, the pigment, or the mixture thereof may be present in an amount of about 10 parts by weight to about 250 parts by weight, for example about 200 parts by weight to about 250 parts by weight, relative to 100 parts by weight of the light-to-heat conversion material. Within this range, the dye, pigment, or mixture thereof may improve heat transfer efficiency without deterioration in dispersibility of the tungsten oxide particles and/or the composite tungsten oxide particles.

In some embodiments, the light-to-heat conversion layer may include a mixture of at least one of particles selected from the tungsten oxide particles and the composite tungsten oxide particles as the light-to-heat conversion material, and carbon black. The mixture may contain about 1 wt % to about 70 wt % of the particles, and about 30 wt % to about 99 wt % of carbon black. For example, the mixture may include about 5 wt % to about 65 wt % of the particles and about 35 wt % to about 95 wt % of carbon black.

The carbon black may have an oil absorption number (OAN) of about 50 cc/100 gram to about 120 cc/100 gram and an average particle diameter of about 40 nm to about 200 nm, etc.

In the light-to-heat conversion layer, the light-to-heat conversion material may be present in an amount of about 5 wt % to about 65 wt %, for example about 20 wt % to about 65 wt %, for example about 20 wt % to about 59 wt %.

The composition for the light-to-heat conversion layer may further include a solvent. The solvent may help to form solutions for preparation of the light-to-heat conversion material, the binder, and the like. The solvent may be the same kind of solvent included in the dispersed solution, or any suitable solvent for formation of the light-to-heat conversion layer. For example, the solvent may be methylethylketone.

The light-to-heat conversion layer may be formed by coating the composition, which contains the aforementioned light-to-heat conversion material and one or more of the binder, the initiator, the dispersant, the dye, the pigment, the carbon black, etc., on a base film, and drying the composition. The dried composition may be cured at about 100 mJ/cm$^2$ to about 500 mJ/cm$^2$. Drying may be performed at about 50° C. to about 100° C., for example about 80° C.

The light-to-heat conversion layer may have a thickness of more than 0 to about 6 μm or less. With this range, the light-to-heat conversion layer may provide efficient heat transfer. For example, the light-to-heat conversion layer may have a thickness from about 0.5 μm to about 5 μm or about 0.5 μm to about 3 μm.

In an example embodiment, referring to FIG. 1, a thermal transfer film 100 may include a base layer 110, and a light-to-heat conversion layer 115 stacked on the base layer 110.

Figure 2:
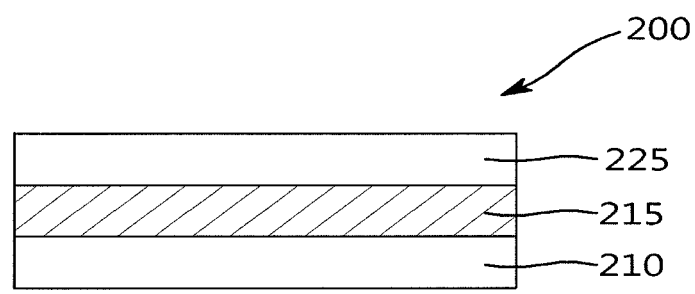
FIG. 2 illustrates sectional view of a thermal transfer film in accordance with another embodiment of the present invention.

In another example embodiment, referring to FIG. 2, a thermal transfer film 200 may include a base layer 210, a light-to-heat conversion layer 215 stacked on the base layer 210, and an intermediate layer 225 stacked on the light-to-heat conversion layer 215. The light-to-heat conversion layer 215 may be formed under the intermediate layer 225 and on an upper surface of the base layer 210.

As used herein, the terms "upper" and "lower" are defined with reference to the drawings and may also be interpreted as "lower" and "upper" according to orientation.

Base Layer

The base layer may have good adhesion to the light-to-heat conversion layer adjacent thereto and allow thermal transfer between the light-to-heat conversion layer and other layers.

Any suitable transparent polymer film may be used as the base layer. For example, the base layer may be composed of at least one transparent polymer film selected from polyester, polyacrylic, polyepoxy, polyethylene, polypropylene, and polystyrene films, etc. For example, the base layer may be a polyester film such as a polyethylene terephthalate film or a polyethylene naphthalate film.

The base layer may have a thickness from about 10 μm to about 500 μm. For example, the base layer may have a thickness from about 30 μm to about 500 μm or about 40 μm to about 100 μm.

Intermediate Layer

The intermediate layer may be used to prevent damage or contamination of a transfer material of the transfer layer, and to reduce distortion of the transfer material of the transfer layer. Further, the intermediate layer may improve adhesion of the transfer layer to the light-to-heat conversion layer, and may control release of the transfer layer on a patterned region of a receptor and on a pattern-free region of the receptor.

In an example embodiment, the intermediate layer may include a polymer film, a metal layer, inorganic layers (e.g., layers formed by sol-gel deposition and vapor deposition of inorganic oxide, for example, silica, titania, and other metal oxides), and an organic/inorganic complex layer. As for the organic layer, both thermosetting and thermoplastic materials may be used.

In another embodiment, the intermediate layer may be formed of a composition containing a UV curable resin, a polyfunctional monomer, and an initiator. In an embodiment, the intermediate layer may be a cured product of a composition, which contains about 40 wt % to about 80 wt % of the UV curable resin, about 10 wt % to about 50 wt % of the polyfunctional monomer, and about 1 wt % to about 10 wt % of the initiator.

The intermediate layer may further include at least one of a UV curable fluorine compound and a UV curable siloxane compound. The UV curable fluorine compound may include a fluorine-modified multifunctional (meth)acrylate, for example, 1H,1H,10H,10H-perfluorodecanediol 1,10-di(meth)acrylate, etc. The UV curable siloxane compound may include (meth)acrylic group-containing polyether-modified dialkylpolysiloxane, etc. The UV curable resin, the polyfunctional monomer, and the initiator may be the same as those described above.

The intermediate layer may have a thickness from about 1 μm to about 10 μm, e.g., about 2 μm to about 5 μm. Within this range, the intermediate layer may be used for the thermal transfer film.

The thermal transfer film may further include a transfer layer.

Transfer Layer

The transfer layer may include a transfer material formed of, for example, organic electroluminescent materials and the like. When laser light having a certain wavelength is irradiated to the thermal transfer film with the transfer layer adjoining a surface of a receptor having a certain pattern, the light-to-heat conversion layer absorbs thermal energy and expands by the heat, and the transfer material of the transfer layer is thermally transferred to the receptor so as to correspond to the pattern.

The transfer layer may include at least one layer for transferring the transfer material to the receptor. These layers may be formed of organic, inorganic, metal, or other materials including electroluminescent materials or electrically active materials.

The transfer layer may be uniformly coated on the light-to-heat conversion layer via evaporation, sputtering, or solvent coating. Alternatively, the transfer layer may be coated in a predetermined pattern via digital printing, lithography printing, evaporation, or sputtering through a mask.

The transfer layer may be formed on an upper side of the light-to-heat conversion layer, or on an upper side of the intermediate layer.

The thermal transfer film according to the present invention may be used as a donor film for OLEDs, or a donor film for laser transfer, etc.

In an example embodiment, the thermal transfer film may be used as a donor film for laser transfer, and facilitates formation of fine patterns for an organic electroluminescent device composed of organic materials.

In accordance with another aspect of the invention, an organic electroluminescent device (including an organic light emitting diode (OLED)) may be prepared using the thermal transfer film. Specifically, a donor film is placed on a substrate on which a transparent electrode layer is formed. The donor film (thermal transfer film) includes the base layer, the light-to-heat conversion layer, and the transfer layer sequentially stacked in this order, as described above. The donor film is illuminated with light. When emitted from a transfer device, the light activates the light-to-heat conversion layer through the base layer, and the activated light-to-heat conversion layer emits heat through thermal decomposition. Then, the light-to-heat conversion layer of the donor film expands by the heat to allow the transfer layer to be separated from the donor film, so that a light emitting layer formed of the transfer material is transferred to a desired thickness in a desired pattern on a pixel region defined on a substrate of the organic electroluminescent device by a pixel defining layer.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of components used in the Examples and Comparative Examples were as follows.

(A) Light-to-heat conversion material: Tungsten oxide particles

Tungsten oxide particles ($WO_3$ particles having an average particle diameter of 70 nm) were provided in the form of a tungsten oxide particle dispersed solution (T-sol, AMTE Co., Ltd.). The tungsten oxide particle dispersed solution contained 30 wt % of the tungsten oxide particles, 12 wt % of an acrylic polymer dispersant, and 58 wt % of methylethylketone.

(B) Binder: UV curable acrylate resin (IRG-205, Nippon Kayaku Company Ltd.)

(C) Initiator: Irgacure 184 (BASF)

(D) Base layer (base film): Polyethylene terephthalate film (PET, A4300, Thickness: 75 μm, Toyobo)

(E) Carbon black: A millbase (Raven 450, Columbia) containing 35 wt % of carbon black particles (having an average particle diameter of 65 nm and oil absorption number of 65 cc/100 gram, as measured in accordance with ASTM D3849 and ASTM D2414, respectively) as a dispersed solution, and 4.5 wt % of polyvinyl acetate as a dispersant, and 60.5 wt % of methylethylketone as a solvent were used.

Example 1

To 100 parts by weight of methylethylketone as a solvent, 5 parts by weight of the UV curable acrylate resin, 60 parts by weight of the tungsten oxide particle dispersed solution, and 0.5 parts by weight of the initiator were added. Then, the prepared composition was stirred for 30 minutes, thereby preparing a composition for a light-to-heat conversion layer. The composition was coated on the base film using an applicator, dried in an oven at 80° C. for 2 minutes, and cured at 300 mJ/cm$^2$ under a nitrogen atmosphere, thereby preparing a film including a light-to-heat conversion layer having a 3 μm thickness.

Example 2

To 100 parts by weight of methylethylketone as a solvent, 30 parts by weight of the UV curable acrylate resin, 30 parts by weight of the tungsten oxide particle dispersed solution, and 0.5 parts by weight of the initiator were added. Then, the prepared composition was stirred for 30 minutes, thereby preparing a composition for a light-to-heat conversion layer. The composition was coated on the base film using an applicator, dried in an oven at 80° C. for 2 minutes, and cured at 300 mJ/cm$^2$ under a nitrogen atmosphere, thereby preparing a film including a light-to-heat conversion layer having a 3 μm thickness.

Example 3

To 100 parts by weight of methylethylketone as a solvent, 50 parts by weight of the UV curable acrylate resin, 20 parts by weight of the tungsten oxide particle dispersed solution, 40 parts by weight of the carbon black dispersed solution, 0.5 parts by weight of the initiator, and 1.0 part by weight of the dispersant (acrylic polymer dispersant) were added. Then, the prepared composition was stirred for 30 minutes, thereby preparing a composition for a light-to-heat conversion layer. The composition was coated on the base film using an applicator, dried in an oven at 80° C. for 2 minutes, and cured at 300 mJ/cm$^2$ under a nitrogen atmosphere, thereby preparing a film including a light-to-heat conversion layer having a 3 μm thickness.

Comparative Example 1

A film including a 3 μm thick light-to-heat conversion layer was prepared in the same manner as in Example 1, except that 5 parts by weight of the UV curable acrylate resin, 150 parts by weight of the tungsten oxide particle dispersed solution, and 0.5 parts by weight of the initiator were used.

Comparative Example 2

To 100 parts by weight of methylethylketone as a solvent, 70 parts by weight of the UV curable acrylate resin, 60 parts by weight of the carbon black dispersed solution, 0.5 parts by weight of the initiator, and 1.0 part by weight of a dispersant (acrylic polymer dispersant) were added. Then, the prepared composition was stirred for 30 minutes, thereby preparing a composition for a light-to-heat conversion layer. The composition was coated on the base film using an applicator, dried in an oven at 80° C. for 2 minutes, and cured at 300 mJ/cm$^2$ under a nitrogen atmosphere, thereby preparing a film including a light-to-heat conversion layer having a 3 μm thickness.

Comparative Example 3

A film including a 3 μm thick light-to-heat conversion layer was prepared in the same manner as in Example 1, except that 60 parts by weight of the UV curable acrylate resin, 25 parts by weight of the tungsten oxide particle dispersed solution, and 0.5 parts by weight of the initiator were used.

The prepared thermal transfer films were evaluated as to the following properties and results are shown in Table 1.

(1) OD (Optical Density): OD was measured on each film including a 3 μm thick light-to-heat conversion layer at wavelength 970 nm using a Perkin Elmer Lambda 950 UV-VIS spectrometer. Although a desired OD was set to 1.5±0.5, embodiments are not limited thereto.

(2) Curing rate: A solvent (methylethylketone) was deposited over a wide area on the thermal transfer film. Then, the curing rate was recorded using a stopwatch. Next, the solvent was removed from the film using a clean room wiper each 10 seconds. A period of time for which the coating layer withstood the solvent was recorded, and a time at which the coating layer was peeled off, or a time at which the coating layer was stuck to the wiper was recorded.

(3) Preparation of composition: After mixing the respective components of the compositions in Examples and Comparative Examples, the preparation of the composition was determined. When the coating layer is not cured, this result indicates that the composition does not function properly. A curing rate of 30 sec or more was evaluated to be 'good', and a curing rate of less than 30 sec was evaluated to be 'poor'.

(4) Appearance: After coating the composition on the base film, the film was observed by the naked eye through a reflective plate or in a transmission manner. A uniformly coated appearance was evaluated as 'good', and stain was evaluated as 'poor'.

TABLE 1

|  | Example | | | Comparative Example | | |
| --- | --- | --- | --- | --- | --- | --- |
|  | 1 | 2 | 3 | 1 | 2 | 3 |
| Content of light-to-heat conversion material in light-to-heat conversion layer (wt %) | 58.6 | 20.8 | 26.4 | 65.7 | 22.1 | 10.56 |
| OD (1.5 ± 0.5, no unit) | 1.5 | 1.0 | 1.1 | 1.8 | 1.3 | 0.2 |
| Curing rate (sec) | 30 | 60 | 30 | 5 | 20 | 80 |
| Formation of composition | good | good | good | poor | poor | good |
| Appearance | good | good | good | poor | poor | good |

As shown in Table 1, in Examples 1 and 2 wherein each light-to-heat conversion layer was formed using a specific amount of tungsten oxide particles according to an example embodiment, the film of Example 1 had an excellent optical density of 1.5, and the film of Example 2 had a relatively high optical density of 1.0, while providing a good appearance and a high curing rate. In Example 3 wherein the mixture of tungsten oxide particles and carbon black particles was used, the film exhibited good optical density and appearance.

On the other hand, in Comparative Example 1 wherein the content of the tungsten oxide particles exceeded 65 wt %, the film provided optical density, but it was difficult to prepare the composition and the film had a poor appearance. In Comparative Example 2 wherein the composition contained carbon black without the tungsten oxide particles, the film had a poor appearance and a lower curing rate than the film of Example 1. In Comparative Example 3 wherein the content of the tungsten oxide particles was less than 20 wt %, the optical density was somewhat low. Accordingly, the films of Comparative Examples 1 to 3 did not provide all of the advantageous effects of the Examples.

By way of summation and review, a thermal transfer film may include a light-to-heat conversion layer formed on a receptor substrate and a transfer layer formed on the light-to-heat conversion layer and containing a luminescent material, or an electron or hole transport compound. In light-induced thermal transfer, the light-to-heat conversion layer should maintain uniform coating without reducing optical density.

A thermal transfer film may include a light-to-heat conversion layer composed of carbon black. For the light-to-heat conversion layer, carbon black has been used as a light-to-heat conversion material to provide a function of light-to-heat conversion. However, carbon black may be difficult to uniformly disperse due to the tendency thereof to agglomerate, thereby making it difficult to maintain good coating appearance and uniformity of the light-to-heat conversion layer. Generally, carbon blacks, used as light-to-heat conversion material for a light-to-heat conversion layer, may absorb a broad range of wavelengths of light, and thus increase the heat transfer efficiency of the light-to-heat conversion layer. However, carbon blacks tend to agglomerate and disrupt uniform dispersion over time. As a result, carbon blacks may not maintain good coating appearance and uniformity of the light-to-heat conversion layer. Moreover, carbon blacks may deteriorate scratch resistance of the light-to-heat conversion layer. Meanwhile, organic dyes or pigments, or metal complexes may secure uniform coating, but exhibit low durability with respect to heat or light.

As described above, embodiments relate to a thermal transfer film, which includes a light-to-heat conversion (LTHC) layer including at least one of particles selected from tungsten oxide particles and composite tungsten oxide particles, and an organic electroluminescent device prepared using the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thermal transfer film, comprising:
    a base layer;
    a light-to-heat conversion layer on the base layer, the light-to-heat conversion layer including at least one of particles selected from tungsten oxide particles and composite tungsten oxide particles, the particles being present in an amount of about 20 wt % to about 65 wt % in the light-to-heat conversion layer; and
    a target layer on the light-to-heat conversion layer, the light-to-heat conversion layer being between the target layer and the base layer.

2. The thermal transfer film as claimed in claim 1, wherein the particles have an average particle diameter of greater than 0 to about 500 nm or less.

3. The thermal transfer film as claimed in claim 1, wherein:
    the light-to-heat conversion layer includes the tungsten oxide particles, and
    the tungsten oxide particles are represented by Formula $W_yO_z$, where W is tungsten, O is oxygen, and $2.2 \leq z/y \leq 3.0$.

4. The thermal transfer film as claimed in claim 1, wherein:
    the light-to-heat conversion layer includes the composite tungsten oxide particles, and
    the composite tungsten oxide particles are represented by Formula $M_xW_yO_z$, where M is at least one element selected from H, He, an alkali metal, an alkali earth metal, a rare earth element, a halogen, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, P, S, Se, Te, Ti, Nb, V, Mo, Ta, Re, Hf, Os, and Bi; W is tungsten; O is oxygen; $0.001 \leq x/y \leq 1.1$; and $2.2 \leq z/y \leq 3.0$.

5. The thermal transfer film as claimed in claim 1, wherein the light-to-heat conversion layer includes a cured product of a composition that includes at least one of particles selected from the tungsten oxide particles and the composite tungsten oxide particles, and a binder.

6. The thermal transfer film as claimed in claim 5, wherein the composition further includes an initiator.

7. The thermal transfer film as claimed in claim 6, wherein the composition includes about 20 wt % to about 65 wt % of the particles, about 10 wt % to about 75 wt % of the binder, and about 0.1 wt % to about 25 wt % of the initiator in terms of solid content.

8. The thermal transfer film as claimed in claim 6, wherein the composition further includes an acrylic polymer dispersant.

9. The thermal transfer film as claimed in claim 8, wherein the composition includes about 20 wt % to about 65 wt % of the particles, about 10 wt % to about 75 wt % of the binder, about 0.1 wt % to about 25 wt % of the initiator, and about 0.1 wt % to about 30 wt % of the acrylic polymer dispersant in terms of solid content.

10. The thermal transfer film as claimed in claim 8, wherein the particles are included in the composition in the form of a dispersed solution that includes the particles, the acrylic polymer dispersant, and a solvent.

11. The thermal transfer film as claimed in claim 10, wherein the dispersed solution includes about 20 wt % to about 65 wt % of the particles, about 0.1 wt % to about 30 wt % of the acrylic polymer dispersant, and the balance of the solvent.

12. The thermal transfer film as claimed in claim 5, wherein the binder includes a UV curable (meth)acrylate resin.

13. The thermal transfer film as claimed in claim 1, wherein the light-to-heat conversion layer has a coating thickness of greater than 0 to about 6 μm or less.

14. The thermal transfer film as claimed in claim 1, wherein the light-to-heat conversion layer further includes carbon black.

15. The thermal transfer film as claimed in claim 14, wherein the light-to-heat conversion layer includes about 1 wt % to about 70 wt % of the particles and about 30 wt % to about 99 wt % of carbon black in a mixture of the particles and carbon black.

16. The thermal transfer film as claimed in claim 1, further comprising an intermediate layer on the light-to-heat conversion layer, the light-to-heat conversion layer being between the intermediate layer and the base layer, the intermediate layer being between the transfer layer and the light-to-heat conversion layer.

17. A method of preparing an organic electroluminescent device, the method comprising:

placing the thermal transfer film as claimed in claim 1 on a substrate; and illuminating the thermal transfer film with light from the base layer side to activate the light-to-heat conversion layer such that a transfer material is transferred from the transfer layer to a pixel region of the substrate.

* * * * *